United States Patent
Park et al.

(10) Patent No.: US 6,873,016 B2
(45) Date of Patent: Mar. 29, 2005

(54) SEMICONDUCTOR DEVICE AND METHOD OF FORMING THE SAME

(75) Inventors: Jin-Taek Park, Gyeonggi-do (KR); Hong-Soo Kim, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/678,586

(22) Filed: Oct. 3, 2003

(65) Prior Publication Data
US 2004/0070034 A1 Apr. 15, 2004

(30) Foreign Application Priority Data
Oct. 11, 2002 (KR) .................................. 10-2002-0062010

(51) Int. Cl.[7] .......................... H01L 27/01; H01L 27/12; H01L 31/0392
(52) U.S. Cl. ....................... 257/350; 257/359; 257/363; 257/379; 257/380
(58) Field of Search ................................. 257/295, 298, 257/314, 324–326, 350, 359, 363, 379, 380, 533, 536–538

(56) References Cited

U.S. PATENT DOCUMENTS

| | | | | |
|---|---|---|---|---|
| 4,416,049 A | * | 11/1983 | McElroy | 438/238 |
| 5,554,873 A | * | 9/1996 | Erdeljac et al. | 257/380 |
| 6,172,389 B1 | | 1/2001 | Sakoh | |
| 6,228,714 B1 | * | 5/2001 | Choi | 438/258 |
| 6,777,752 B2 | * | 8/2004 | Osanai et al. | 257/350 |

FOREIGN PATENT DOCUMENTS

KR   1020020040094   5/2002

OTHER PUBLICATIONS

English language abstract to Korean Publication No. 1020020040094.

* cited by examiner

*Primary Examiner*—Thien F Tran
(74) *Attorney, Agent, or Firm*—Marger Johnson & McCollom P.C.

(57) ABSTRACT

A semiconductor device including a resistor and a method of forming the same. In the semiconductor device, a conductive pattern, which connects source regions, and a resistor are formed of the same material, which can be polysilicon. In the method, the conductive pattern and the resistor are simultaneously formed. Thus, it is possible to obtain a constant sheet resistance without an additional photo mask.

15 Claims, 13 Drawing Sheets

SEMICONDUCTOR DEVICE AND METHOD OF FORMING THE SAME

CROSS REFERENCE TO RELATED APPLICATIONS

This application claims priority under 35 USC § 119 to Korean Patent Application 2002-62010, filed on Oct. 11, 2002, the contents of which are herein incorporated by reference in their entirety.

BACKGROUND OF THE INVENTION

1. Field of the Invention

The present invention relates to a semiconductor device and a method of forming the same. More particularly, the present invention relates to a semiconductor device with a resistor and to a method of forming the same.

2. Description of the Related Arts

Polysilicon is often used as a resistor in a semiconductor device, since it is easy to control resistance by controlling the impurity doping concentration of the polysilicon. In many conventional non-volatile memory devices, resistors in a peripheral circuit region are formed as explained below.

FIG. 1 illustrates a plan view of a semiconductor device according to a conventional technology. FIG. 2 illustrates cross-sectional views taken along the I–I' line and the II–II' line of FIG. 1, respectively.

Referring to FIGS. 1 and 2, a field oxide (FOX) 32 is formed on a semiconductor substrate 31, which is divided into a cell array region "a" and a peripheral circuit region "b," thereby defining an active region (AR). A tunnel oxide layer 33, a charge trapping layer 35, a blocking insulation layer 37, a polysilicon layer 39, and a tungsten silicide layer 40 are sequentially stacked on the surface of the semiconductor substrate 31. The layers 40, 39, 37, 35, and 33 are sequentially patterned to form one string of word lines (WL) 41w that cross over the active region (AR) and are parallel to each other at the cell array region "a." Simultaneously, a string selection line (SSL, not shown) and a ground selection line (GSL) 41g are formed at both sides of the one string of the world lines (WL) 41w, respectively. Also, a resistor (R) 41r is formed on the field oxide 32 at the peripheral circuit region "b" by a patterning process. After finishing the patterning process, impurities are implanted into the exposed active region (AR), thereby forming an impurity region (43). An interlayer dielectric layer 47 is stacked to cover the lines 41w and 41g and the resistor 41r. A common source line (CSL) 45 is formed through the interlayer dielectric layer 47 between a ground selection line 41g and a neighboring ground selection line 41g at the cell array region "a." An additional interlayer dielectric layer is stacked on the common source line 45. The interlayer dielectric layer 47 is then penetrated to form a resistor contact (RC) 49, which electrically connects to the tungsten silicide layer 40 at the peripheral circuit region "b." However, since the tungsten silicide layer 40 has a relatively very low sheet resistance in comparison with polysilicon, the area of the resistor is enlarged.

In order to solve the problem, as illustrated in FIG. 3, a method can be considered, which perfectly removes the tungsten silicide 40 in the peripheral circuit region "b." However, when a dry etch process is performed to remove the tungsten silicide layer 40, an etch rate is difficult to control, which results in an uneven surface and an uneven (that is, non-constant) resistance of the resistor. Also, since a new mask is required for the dry etch, this results in a further complexity during the process. The tungsten silicide layer 40 is hardly ever removed by a wet etch because this method can easily damage the polysilicon layer 39 there under.

SUMMARY OF THE INVENTION

The present invention provides a semiconductor device and a method of forming the same that can obtain a constant sheet resistance without an additional mask and without enlarging the area of a resistor.

The present invention provides a semiconductor device where a resistor and a conductive pattern connecting source regions are formed of the same material. The semiconductor device includes a field insulation layer formed on a semiconductor substrate to define an active region; gate patterns formed on the active region; source regions formed in the active region between the gate patterns; a conductive pattern connecting the source regions and being interposed between the gate patterns; and a resistor formed on the field insulation layer. The conductive pattern and the resistor are formed of the same material.

The conductive pattern and the resistor may be both formed of polysilicon. The gate pattern may include a tunnel insulation layer, a charge trapping layer, a blocking insulation layer, and a gate electrode that are sequentially stacked from the semiconductor substrate. The tunneling oxide layer and the blocking insulation layer may be formed of oxide. The charge trapping layer may be formed of nitride. The gate electrode may include a polysilicon layer and a metal silicide layer that are sequentially stacked. The conductive pattern and the resistor may also be horizontally aligned. The semiconductor device may further include spacers covering the sidewalls of the gate pattern. These spacers may be formed of either a nitride or an oxide. The semiconductor device may further include a dummy gate pattern on the field insulation layer adjacent to the resistor.

The semiconductor device may be formed by the following method. First, a field insulation layer is formed to define an active region on a semiconductor substrate. A gate insulation layer and a gate conductive layer are then sequentially formed at the surface of the semiconductor substrate where the field insulation layer is formed. The gate conductive layer and the gate insulation layer are sequentially patterned to form a gate pattern comprising a gate insulation pattern and a gate conductive pattern on the active region. Next, impurities are implanted into the active region, between the gate patterns, by using the gate patterns as ion-implantation masks to form a source region. An interlayer dielectric layer is formed at the surface of the semiconductor substrate where the source region is formed. A first groove and a second groove are formed to expose the source region and the field insulation layer, respectively through the interlayer dielectric layer. Additionally, a conductive pattern is formed to fill the first groove and connect to the source region, while simultaneously, a resistor is formed to fill the second groove on the field insulation layer.

The conductive layer may be formed of polysilicon. The gate insulation layer may include a tunnel insulation layer, a charge trapping layer, and a blocking insulation layer that are sequentially stacked. The tunnel insulation layer and the blocking insulation layer may be formed of oxide, while the charge trapping layer may be formed of nitride. The gate conductive layer may include a polysilicon and a metal silicide that are sequentially stacked. A dummy gate pattern may be formed on the field insulation layer when the gate pattern on the active region is formed. After forming the source region, spacers may be formed on the sidewalls of the gate pattern. The spacer may be formed of either an oxide or a nitride.

DETAILED DESCRIPTION OF THE PREFERRED EMBODIMENT

Figure 1:
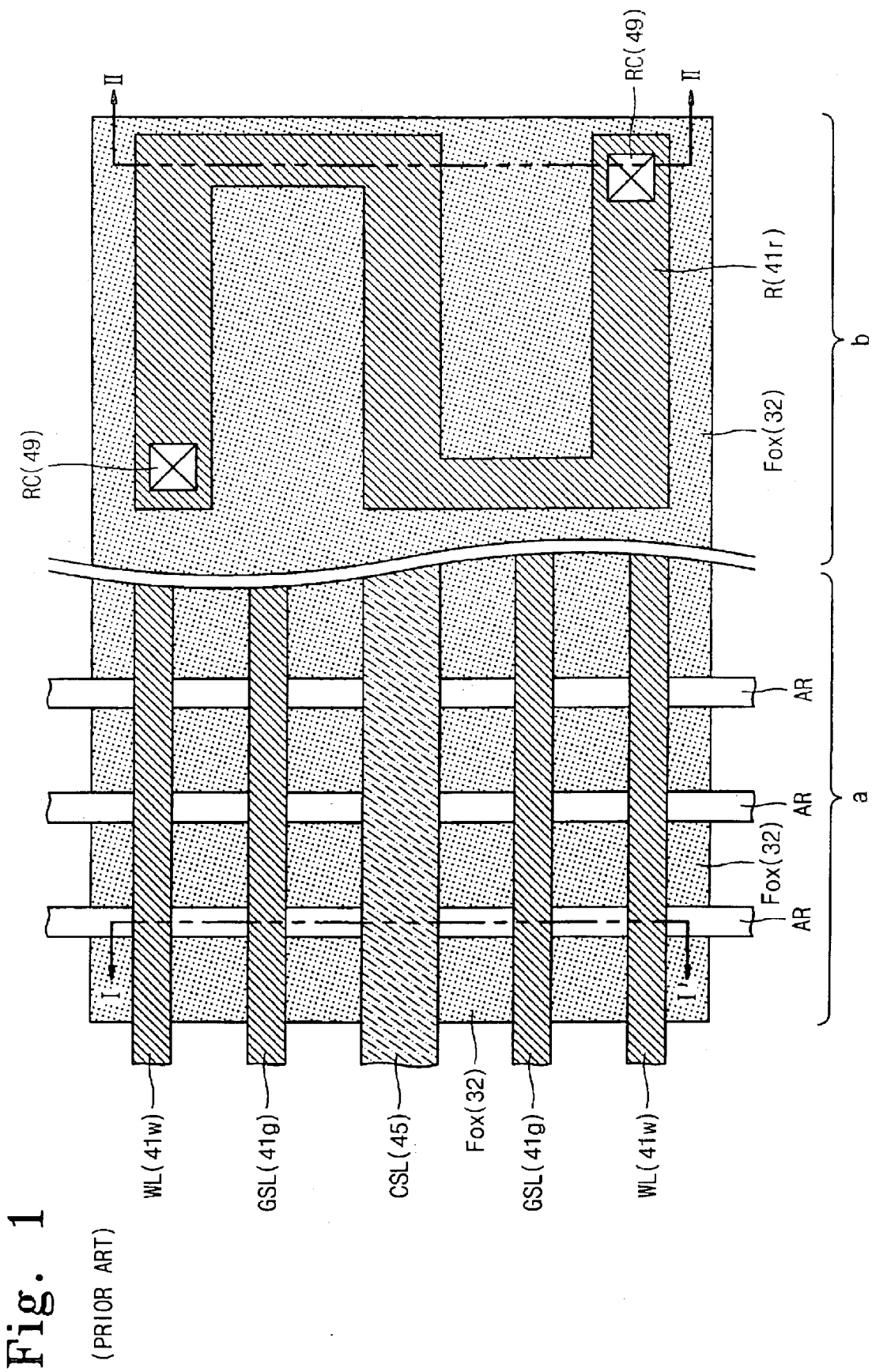
FIG. 1 illustrates a plan view of a semiconductor device according to a conventional technology.
Figure 2:
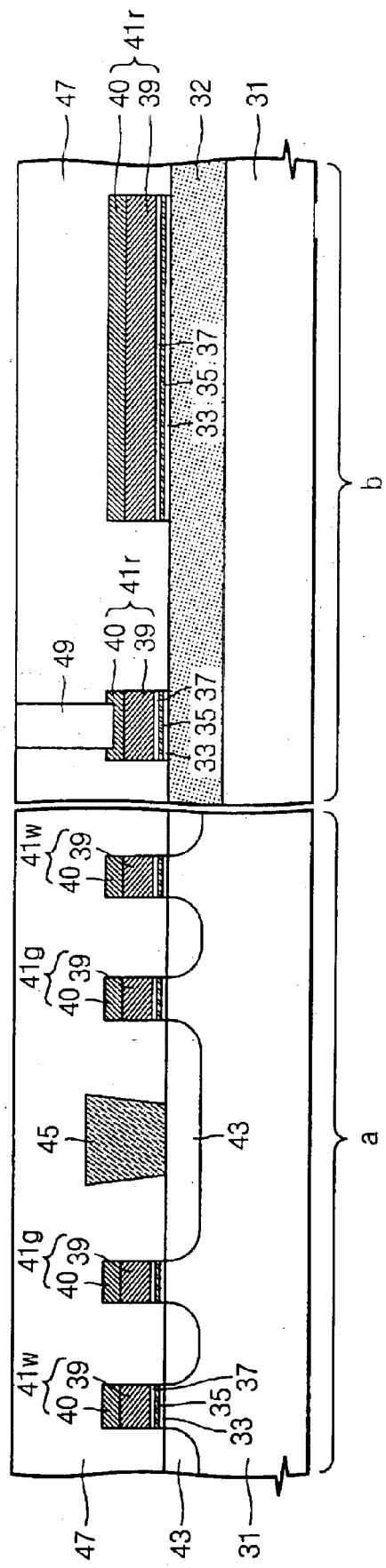
FIG. 2 illustrates cross-sectional views taken along the I–I' line and the II–II' line of FIG. 1, respectively according to one conventional technology.
Figure 3:
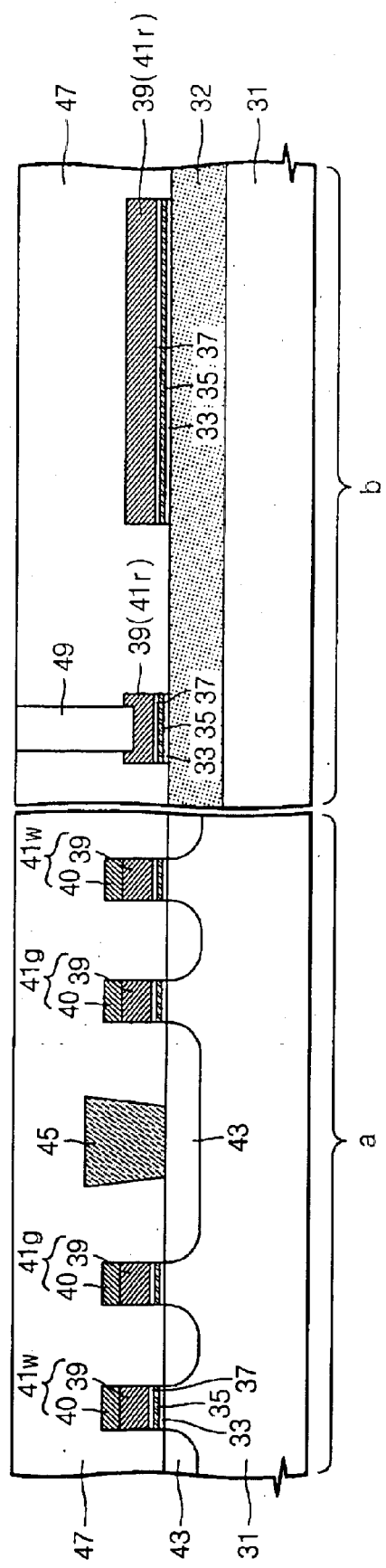
FIG. 3 illustrates cross-sectional views taken along the I–I' line and the II–II' line of FIG. 1, respectively according to another conventional technology.

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough, complete, and will fully convey the scope of the invention to those skilled in the art.

In the drawings, the thickness of layers and regions are exaggerated for clarity. It will be understood that when an element such as a layer, region, or substrate is referred to as being "on" another element, it can be directly on the other element or intervening elements may also be present.

Furthermore, relative terms, such as "beneath", may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as "below" other elements would then be oriented "above" the other elements. Therefore, the term "below" can encompass both an orientation of above and below a designated component.

It will also be understood that although the terms "first" and "second" are used herein to describe various regions, layers, and/or sections, these regions, layers, and/or sections should not be limited by these terms. These terms are only used to distinguish one region, layer, or section from another region, layer or, section. Thus, a first region, layer, or section discussed below could be termed a second region, layer, or section, and vice versa, without departing from the teachings of the present invention. Like numbers refer to like elements throughout. In FIGS. 4, 5, 6A–6C, 7, 8 and 9A–9C, the letter "a" indicates a cell array region the letter "b" indicates a peripheral circuit region.

Figure 4:
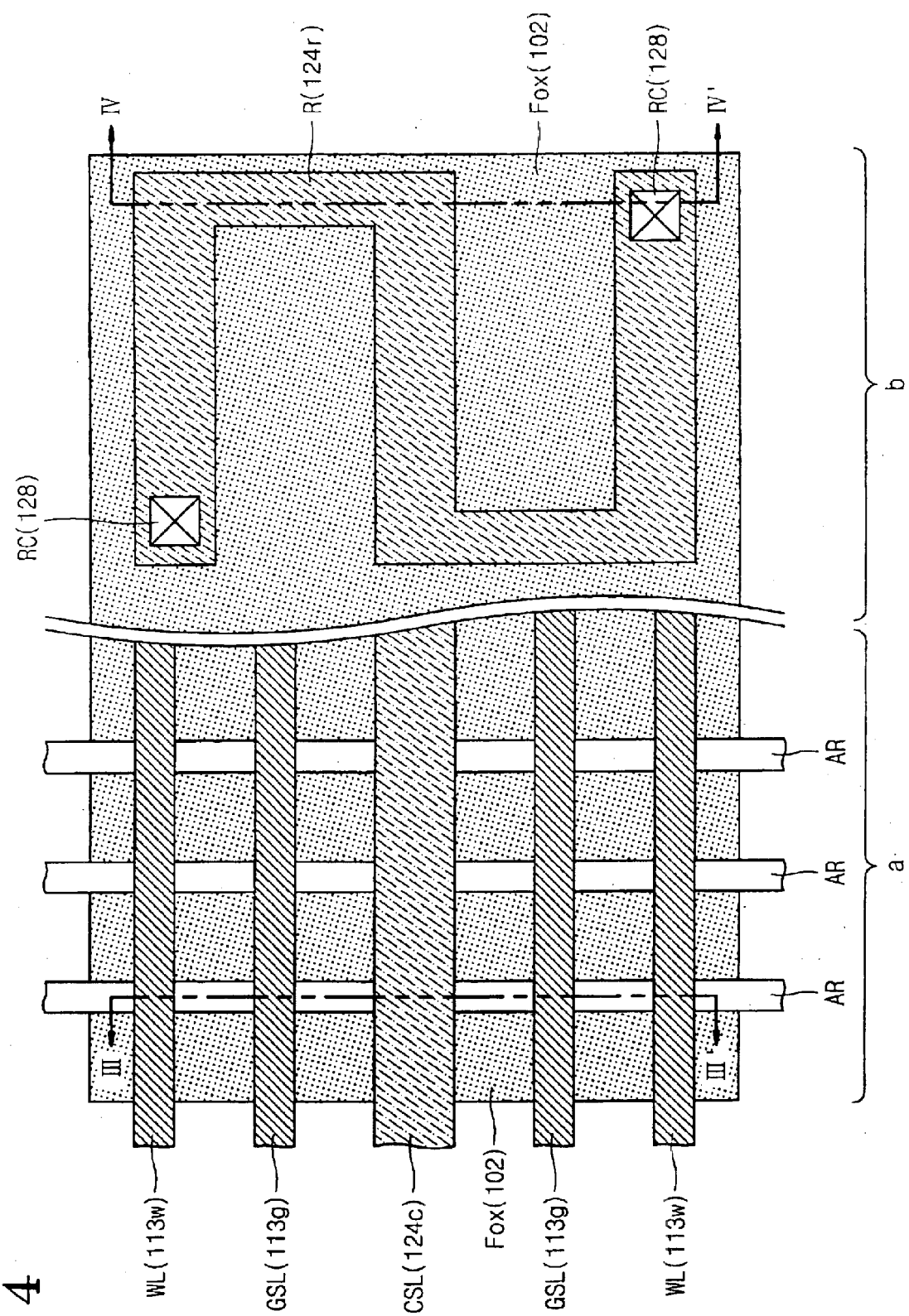
FIG. 4 illustrates a plan view of a semiconductor device according to an embodiment of the present invention.

FIG. 4 illustrates a plan view of a semiconductor device according to an embodiment of the present invention.

Figure 5:
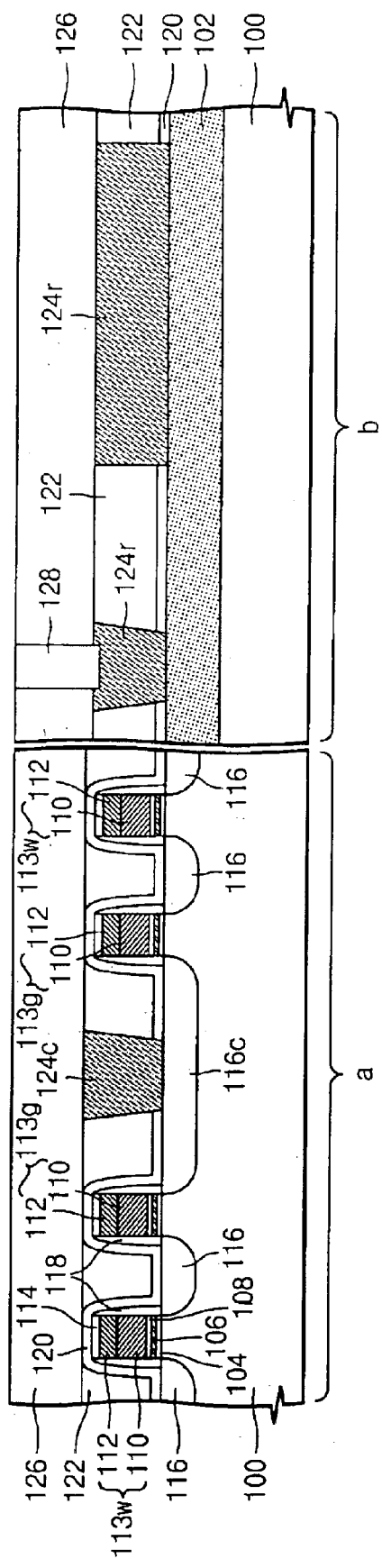
FIG. 5 illustrates cross-sectional views taken along the III–III' line and the IV–IV' line of FIG. 4, respectively according to this embodiment of the present invention.

FIG. 5 illustrates cross-sectional views taken along the III–III' line and the IV–IV' line of FIG. 4, respectively according to this embodiment of the present invention.

Referring to FIGS. 4 and 5, a field isolation layer, e.g., a field oxide (FOX) 102, is present on a semiconductor substrate 100 to define an active region (AR). One string of word lines (WL) 113w parallel to each other are disposed to cross over the active region (AR) at the cell array region "a." A string selection line (SSL, not shown) and a ground selection line (GSL) 113g are disposed at each side of the string of word lines (WL), respectively. The structure including the string of the word lines, the string selection line, and the ground selection line is symmetrically repeated in the cell array region "a." Impurity-doped regions 116 are disposed in the active region (AR) among the lines. Out of the impurity-doped regions, an impurity-doped region disposed between the ground selection line 113g and a neighboring ground selection line 113g is named as a common source region 116c. A common source line (CSL) 124c is disposed on and along the common source region 116c. The lines WL, SSL, and GSL are formed of a polysilicon 110 and a tungsten silicide 112. A blocking insulation layer 108, a charge trapping layer 106, and a tunnel insulation layer, e.g., a tunnel oxide 104, are sequentially interposed between the lines WL, SSL, and GSL and the semiconductor substrate 100, thereby composing a structure of a SONOS type. Spacers 118 cover each sidewall of the lines WL, SSL, and GSL. The top sections of the lines WL, SSL, and GSL are covered by a capping layer pattern 114. A resistor (R) 124r is present on the field oxide 102. Resistor contacts (RC) 128, for applying voltage to the resistor, are present at both ends of the resistor 124r. An etch stopping layer 120 covers the most of the surface of the semiconductor substrate 100, with the exception of the area where the common source line (CSL) and the resistor (R) are formed. A first interlayer dielectric layer 122 fills the gaps among the lines WL, SSL, GSL, and CSL, and the resistors. A second interlayer dielectric layer 126 covers the first interlayer dielectric layer 122. The common source line (CSL) 124c and the resistor (R) 124r are formed of the same material, and which is preferably of polysilicon.

A method of forming the semiconductor device illustrated in FIGS. 4 and 5 is explained with reference to FIGS. 6A through 6C.

Figure 6A:
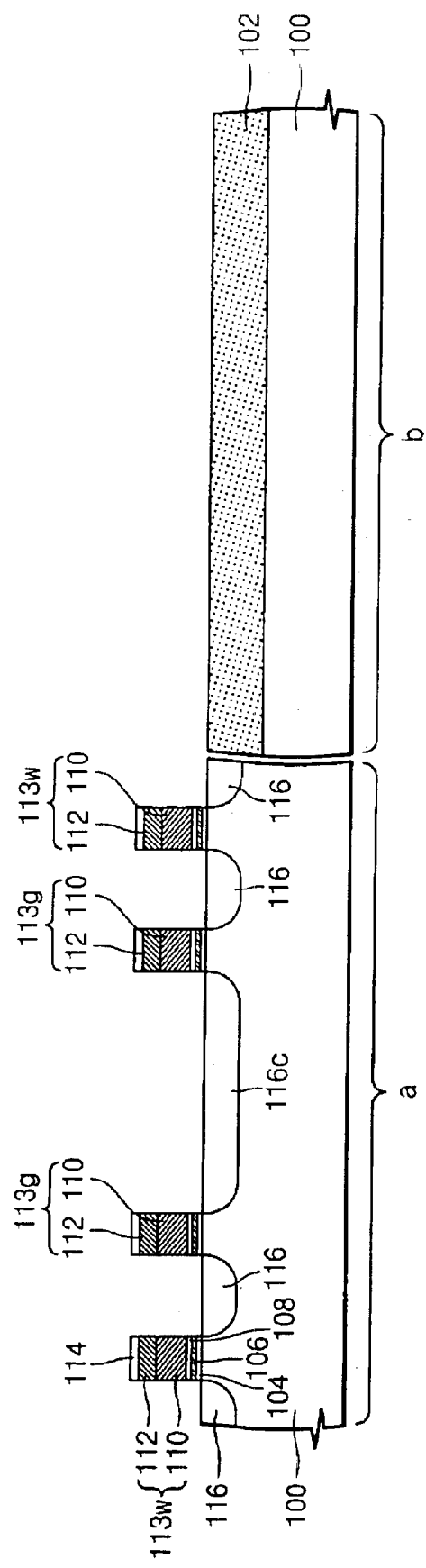
FIGS. 6A through 6C illustrate sequential cross-sectional views of a method of forming the semiconductor device of FIG. 5 according to this embodiment of the present invention.

Referring to FIG. 6A, a field oxide layer 102 is formed on a semiconductor substrate 100, thereby defining an active region (AR). A silicon oxide layer, a silicon nitride layer, an oxide layer, a polysilicon layer, and a tungsten layer are sequentially stacked on the surface of the semiconductor substrate 100. A capping layer pattern 114 is then formed on the tungsten silicide layer at the cell array region "a" to form each of the lines of WL, SSL, and GSL. The capping layer functions as a hard mask layer and protects the layers underneath it. Next, a patterning process is performed by using the capping layer pattern 114 as an etch mask, thereby forming gate patterns composing the lines of GSL, CSL, and WL at the cell array region "a." The gate pattern is composed of a tunnel oxide layer 104, a charge trapping layer 106, a blocking insulation layer. 108, a polysilicon layer 110, a tungsten silicide layer 112, and a capping layer pattern 114 that are sequentially stacked on the semiconductor substrate 100.

Figure 6B:
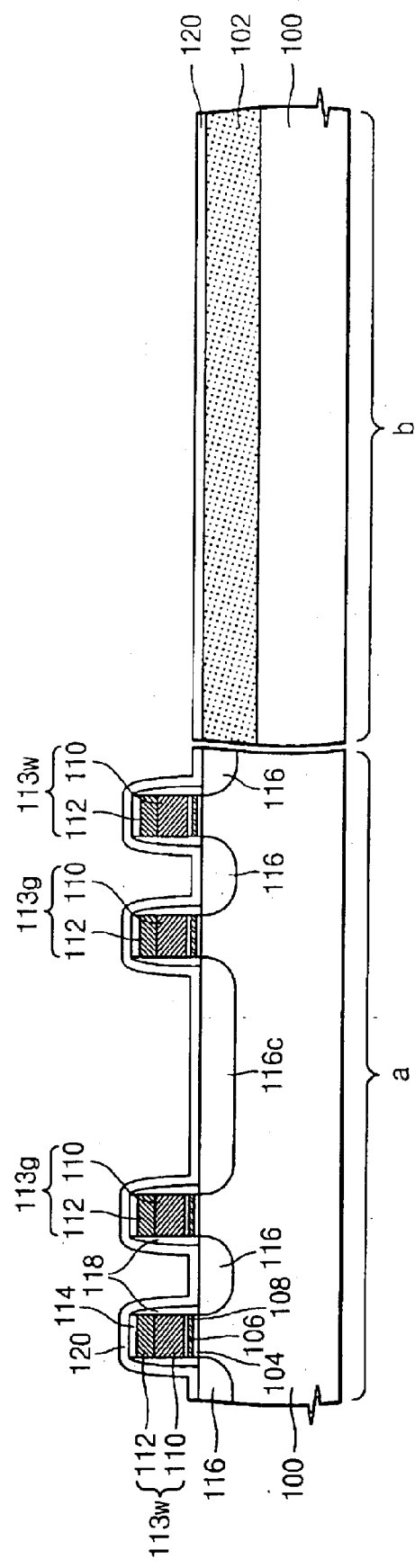

Referring to FIG. 6B, impurity-doped regions 116 are formed in the active region (AR) by using the gate patterns as ion-implantation masks. Out of the impurity-doped regions, the impurity-doped region 116 disposed between ground selection lines 113g is referred to as the common source region 116c. An insulation layer is conformally stacked on the surface of the semiconductor substrate 100 where the impurity-doped region 116 is formed. The insulation layer may be formed of silicon nitride or silicon oxide. The insulation layer is then anisotropically etched to form spacers 118 on the sidewalls of the gate patterns. At this time, an etch-back process or a dry etch process may be employed as the anisotropic etch process. An etch stopping layer 120 is conformally stacked on the surface of the semiconductor substrate 100 including the spacers 118. The etch stopping layer 120 may be formed of silicon nitride.

Figure 6C:
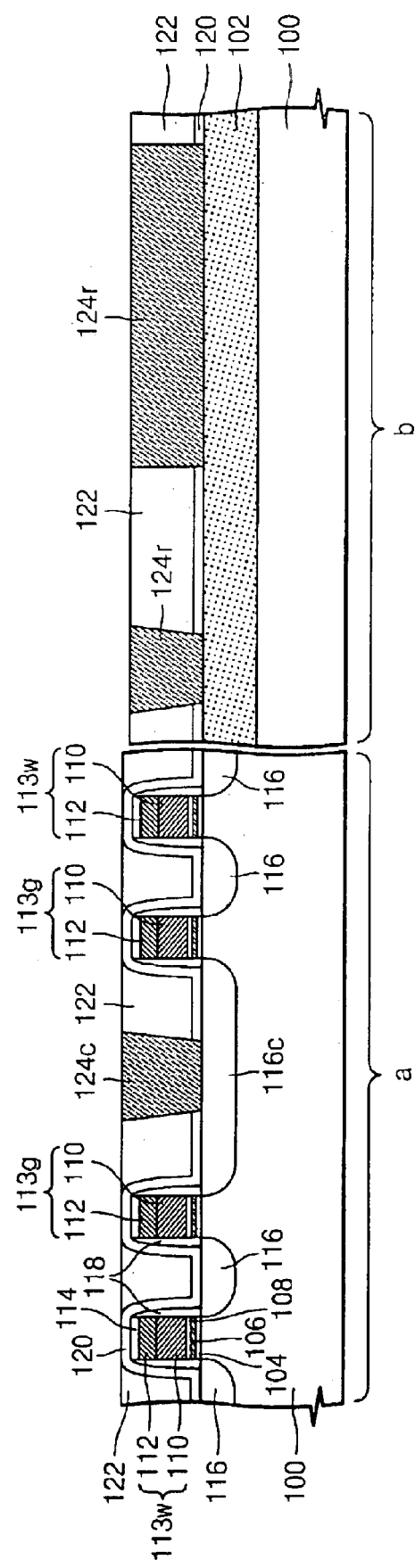

Referring to FIG. 6C, a first interlayer dielectric layer 122 is stacked on the surface of the semiconductor substrate 100 where the etch stopping layer 120 is formed. This process also fills in the gaps between the gate patterns. The first interlayer dielectric layer 122 may be formed of silicon oxide. Next, a chemical mechanical polishing (CMP) process is performed on the first interlayer dielectric layer 122, until the etch stopping layer 120 on top of the gate structures is exposed. At this time, the etch stopping layer 120 functions as a polishing stop layer. Since the pattern density in the peripheral circuit region "b" is lower than at cell array region "a," where the gate patterns are at, a dishing phenomenon may occur during the CMP process. That is, as illustrated in FIG. 6C, the first interlayer dielectric layer 122 may be lower at the peripheral circuit region "b" than at the cell array region "a". After finishing the CMP process, the first interlayer dielectric layer 122 and the etch stopping layer 120 are sequentially patterned to form a first groove exposing the source region 116c at the cell array region "a," and simultaneously to form a second groove exposing the field oxide layer 102 at the peripheral circuit region "b." A conductive layer is then formed on the surface of the semiconductor substrate 100 to fill the first and second grooves. It is subsequently planarized to form a common source line (CSL) 124c, connecting the common source regions 116c at the cell array region "a," and to form a resistor (R) 124r on the field oxide layer 102 at the peripheral circuit region "b." The conductive layer may be formed of polysilicon.

In a subsequent process, referring to FIG. 5, a second interlayer dielectric layer 126 is formed on the surface of the semiconductor substrate 100 including the common source line 124c and the resistor 124r. The second interlayer dielectric layer 126 is patterned to form a resistor contact (RC) 128, which is used for applying a voltage to the ends of the resistor 124r.

Thus, according to this embodiment, because the resistor (R) 124r is formed of polysilicon, whose resistance may be easily controlled by controlling impurity-doping concentration, there is no need to extend area of the resistor 124r. Further, since the common source line (CSL) 124c and the resistor (R) 124c are simultaneously formed, there is no need of an additional photo mask to simplify a total process. Also, there is no need for a conventional dry etch, making it is easy to obtain a constant resistance.

Another embodiment of the present invention includes forming dummy gate patterns at the peripheral circuit region "b" in order to prevent the dishing phenomenon that may occur while performing the CMP process with respect to the first interlayer dielectric layer as described in the embodiment above.

Figure 7:
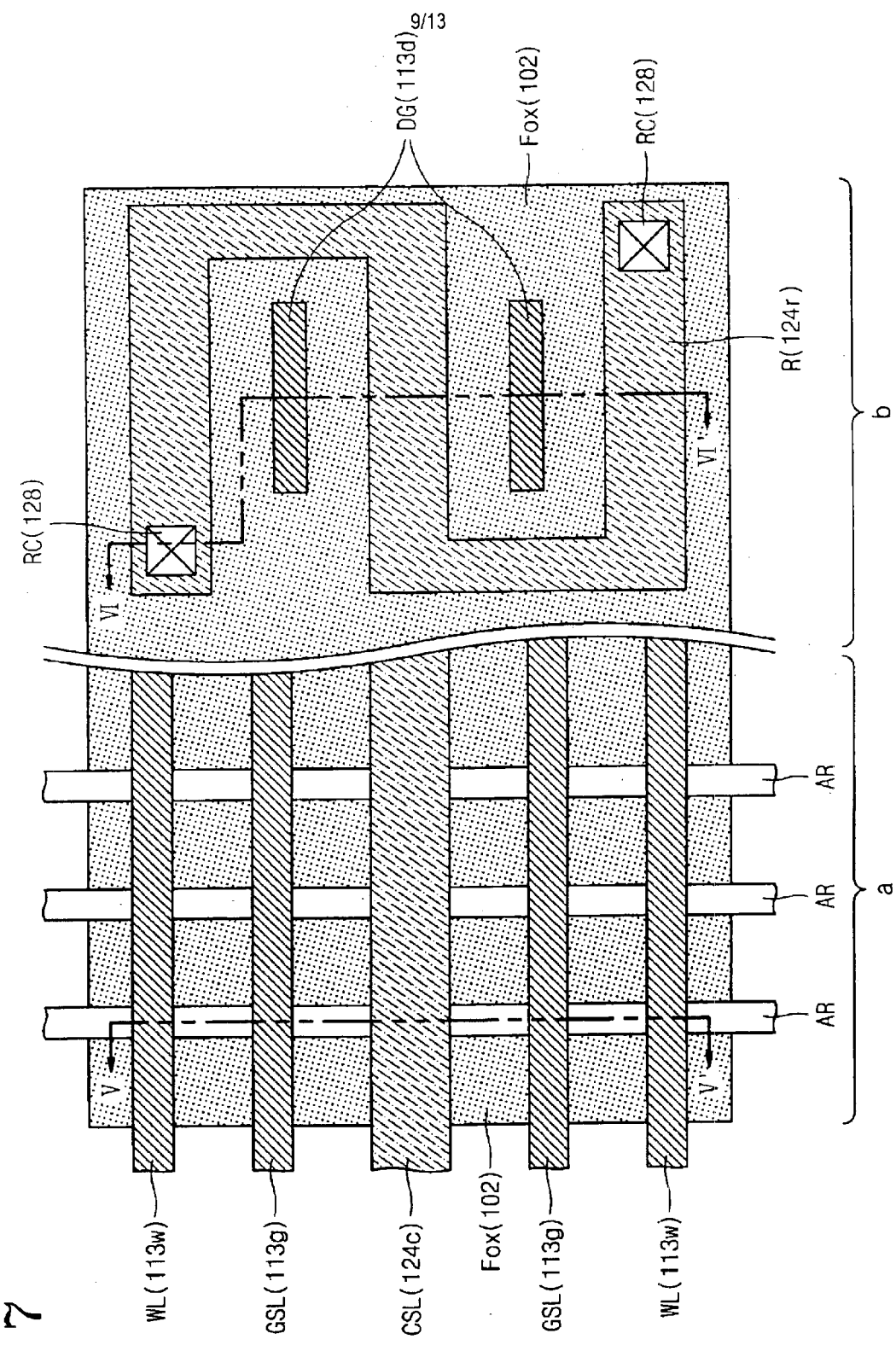
FIG. 7 illustrates a plan view of a semiconductor device according to another embodiment of the present invention.
Figure 8:
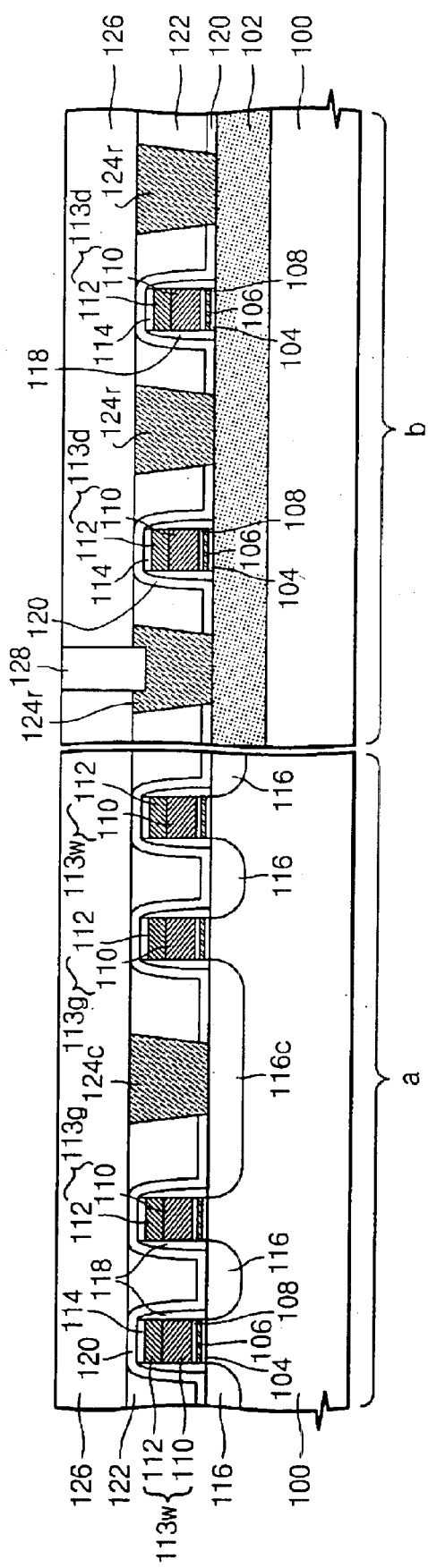
FIG. 8 illustrates cross-sectional views taken along V–V' line and VI–VI' line of FIG. 7 according to this other embodiment of the present invention.

FIG. 7 illustrates a plan view of a semiconductor device according to another embodiment of the present invention. FIG. 8 illustrates cross-sectional views taken along V–V' line and VI–VI' line of FIG. 7 according to another preferred embodiment of the present invention.

Referring to FIGS. 7 and 8, the semiconductor device of the present embodiment is very similar in structure to the device in the previously described embodiment (See FIGS. 5 and 6) with the addition of dummy gate patterns 113d. The dummy gate patterns 113d have the same structure as the gate patterns, which compose of each of the lines WL, SSL, and GSL and are formed on the field oxide layer 102 at the peripheral circuit region "b."

Figure 9A:
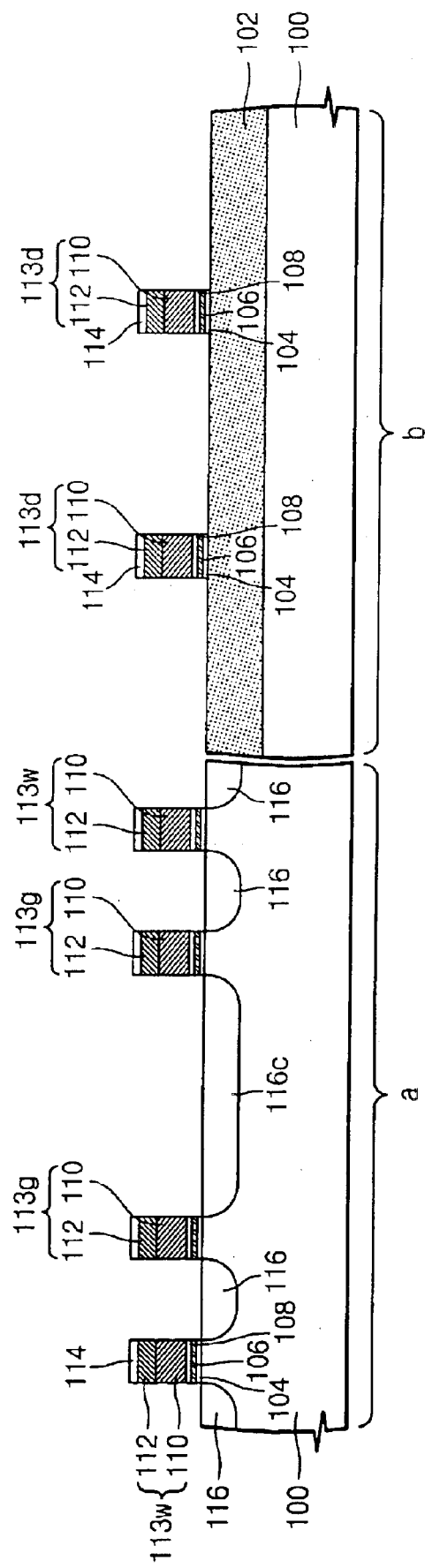
FIGS. 9A through 9C illustrate sequential cross-sectional views of a method of forming the semiconductor device of FIG. 8 according to this other embodiment of the present invention.
Figure 9B:
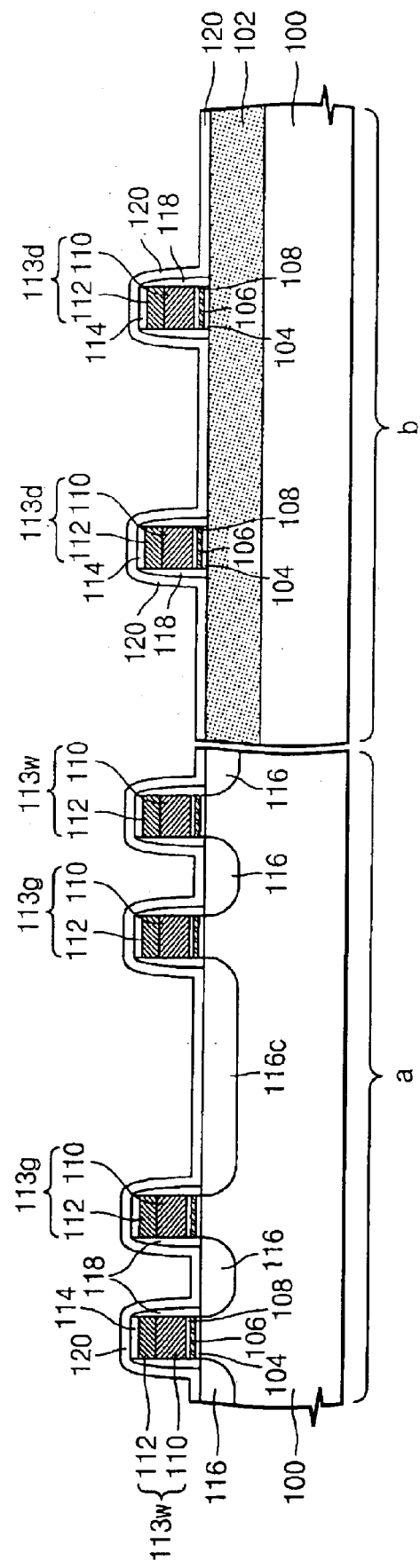
Figure 9C:
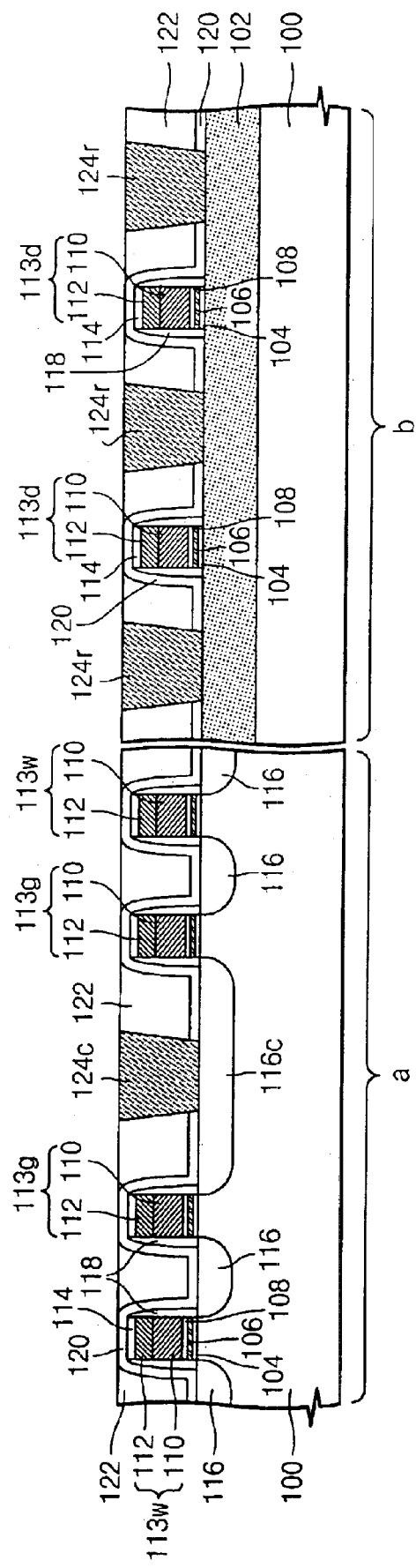

A method of forming the semiconductor device of FIG referring to FIGS. 9A through 9C.

Referring to FIG. 9A, an oxide layer, a nitride layer, an oxide layer, a polysilicon layer, and a tungsten silicide layer are sequentially stacked on the surface of a semiconductor substrate 100 where the field oxide layer 102 is formed. A capping layer pattern 114 is formed on the tungsten silicide layer at the cell array region a to form each lines of WL, SSL, and GSL. The capping layer functions as a hard mask layer and protects the layers underneath it. A patterning process is then performed by using the capping layer pattern 114 as an etch mask, thereby forming gate patterns composing each line GSL, CSL, and WL at the cell array region "a" and forming dummy gate patterns (DG) at the peripheral circuit regions "b." Thus, both the gate pattern and the dummy gate pattern are composed of a tunnel oxide layer 104, a charge trapping layer 106, a blocking insulation layer 108, a polysilicon layer 110, a tungsten silicide layer 112, and a capping layer pattern 114 that are sequentially stacked on the semiconductor substrate 100.

Referring to FIG. 9B, impurity-doped regions 116 are formed in the active region (AR) by using the gate patterns as ion-implantation masks. Out of the impurity-doped regions, an impurity-doped region disposed between ground selection lines 113g is named as a common source region 116c. An insulation layer is conformally stacked on the surface of the semiconductor substrate 100 where the impurity-doped region 116 is formed. The insulation layer may be formed of silicon nitride or silicon oxide. The insulation layer may be anisotropically etched to form spacers 118 on the sidewalls of the gate pattern and the dummy gate pattern. At this time, an etch-back process or a dry etch process may be employed as the anisotropic etch process. An etch stopping layer 120 is conformally stacked on the surface of the semiconductor substrate 100 including the spacers 118. The etch stopping layer 120 may be formed of silicon nitride.

Referring to FIG. 9C, a first interlayer dielectric layer 122 is stacked on the surface of the semiconductor substrate 100 where the etch stopping layer 120 is formed, thereby substantially perfectly filling the gaps between the gate patterns and between the dummy gate patterns. The first interlayer dielectric layer 122 may be formed of silicon oxide. A chemical mechanical polishing (CMP) process is performed on the first interlayer dielectric layer 122 until the etch stopping layer atop the gate patterns is exposed. At this time, the etch stopping layer 120 functions as a polish stopping layer. A dishing phenomenon does not occur because of the dummy gate patterns (DG) in the peripheral circuit region "b." After finishing the CMP process, the first interlayer dielectric layer 122 and the etch stopping layer 120 are sequentially patterned to form a first groove exposing the source region 116c at the cell array region "a," and simultaneously to form a second groove exposing the field oxide layer 102 at the peripheral circuit region "b." A conductive layer is formed on the surface of the semiconductor substrate 100 to fill in the first and second grooves and then planarzed to form a common source line (CSL) 124c, which connects the common source regions 116c at the cell array region "a," and to form a resistor (R) 124r on the field oxide layer 102 at the peripheral circuit region "b." The conductive layer may be formed of polysilicon. At this time, the common source line (CSL) 124c and the resistor (R) 124r have the same height due to the dummy gate pattern (DG).

Similar to the embodiment described first, this embodiment describes a semiconductor device and a method to form the same. However, this subsequent embodiment also makes it possible to obtain constant resistance without a dishing phenomenon.

In the present invention, a resistor is formed of polysilicon whose resistance may be easily managed by controlling the impurity-doping concentration, thus eliminating the need to extend the area of resistor. Additionally, since the common source line and the resistor are simultaneously formed, there is no need for an additional photo mask, which simplifies the total process. Also, because there is no need for a conventional dry etch, a constant resistance is easy to obtain.

While the invention has been shown and described with respect to various embodiments thereof, it should be understood that the invention is not limed to the described embodiments. Those skilled in the art will recognize that various changes in form and detail may be made without departing from the spirit, scope and teaching of the invention. The scope of the invention is limited only by the appended claims.

What is claimed is:

1. A semiconductor device comprising:
    a field isolation layer formed on a semiconductor substrate to define an active region;
    gate patterns formed on the active region;
    source regions formed in the active region between the gate patterns;
    a conductive pattern connecting the source regions and being interposed between the gate patterns; and
    a resistor formed on the field isolation layer,
    wherein the conductive pattern and the resistor are formed of the same material.

2. The semiconductor device as claimed in claim 1, wherein the conductive pattern and the resistor are formed of polysilicon.

3. The semiconductor device as claimed in claim 1, further comprising a dummy gate pattern on the field isolation layer adjacent to the resistor.

4. The semiconductor device as claimed in claim 1, wherein the gate electrode comprises a polysilicon layer and a metal silicide layer that are sequentially stacked.

5. The semiconductor device as claimed in claim 1, further comprising spacers covering sidewalls of the gate pattern.

6. The semiconductor device as claimed in claim 5, wherein the spacers are formed of nitride or oxide.

7. The semiconductor device as claimed in claim 1, wherein the gate pattern comprises a tunnel insulation layer, a charge trapping layer, a blocking insulation layer, and a gate electrode that are sequentially stacked on the semiconductor substrate.

8. The semiconductor device as claimed in claim 7, wherein the tunnel insulation layer and the blocking insulation layer are formed of oxide.

9. The semiconductor device as claimed in claim 7, wherein the charge trapping layer is formed of nitride.

10. The semiconductor device as claimed in claim 7, wherein the gate electrode comprising a polysilicon layer and a metal silicide layer that are sequentially stacked.

11. A semiconductor device comprising;
    an active region on a semiconductor substrate;
    source regions in said active region;
    a conductive pattern connecting said source regions; and
    a resistor, wherein said conductive pattern and said resistor are formed of the same material.

12. The semiconductor device of claim 11, wherein a field isolation layer formed on a semiconductor substrate defines said active region.

13. The device recited in claim 11, wherein said conductive pattern and said resistor are formed of polysilicon.

14. The semiconductor device of claim 11, further comprising gate patterns formed on said active region.

15. The semiconductor device of claim 14, wherein said source regions are formed in the active region between said gate patterns.

* * * * *

UNITED STATES PATENT AND TRADEMARK OFFICE
CERTIFICATE OF CORRECTION

PATENT NO. : 6,873,016 B2
APPLICATION NO. : 10/678586
DATED : March 29, 2005
INVENTOR(S) : Park et al.

It is certified that error appears in the above-identified patent and that said Letters Patent is hereby corrected as shown below:

On Fig. 1, please replace "II" (located under RC(49)) with --II'--

At column 5, line 1, please replace "insulation layer. 108" with --insulation layer 108.--

At column 6, line 19, please replace "semiconductor device of FIG. referring to" with --semiconductor device of FIGS. 7 and 8 is explained be referring to--

At column 8, lines 9-11, please replace claim 4 with --The semiconductor device as claimed in claim 1, wherein the conductive pattern and the resistor are horizontally aligned. --

Signed and Sealed this

Tenth Day of October, 2006

JON W. DUDAS
*Director of the United States Patent and Trademark Office*